United States Patent [19]

Dautriche

[11] Patent Number: 4,951,000
[45] Date of Patent: Aug. 21, 1990

[54] WIDE-BAND PHASE SHIFTER

[75] Inventor: Pierre Dautriche, Chennevieres, France

[73] Assignee: U. S. Philips Corporation, New York, N.Y.

[21] Appl. No.: 363,437

[22] Filed: Jun. 7, 1989

Related U.S. Application Data

[63] Continuation of Ser. No. 145,856, Jan. 20, 1988, abandoned.

[30] Foreign Application Priority Data

Jan. 20, 1987 [FR] France ................. 87 00566

[51] Int. Cl.$^5$ .......................... H03K 5/00; H03K 5/22
[52] U.S. Cl. ..................................... 328/155; 328/55; 328/133; 307/262; 307/512
[58] Field of Search .................... 328/55, 155, 133; 307/511, 512, 513, 262

[56] References Cited

U.S. PATENT DOCUMENTS

| 3,517,223 | 6/1970 | Gault, Jr. ................. | 307/511 |
| 3,624,274 | 11/1971 | Araki et al. ............... | 307/511 X |
| 3,626,308 | 12/1971 | Paine ........................ | 307/512 X |
| 3,633,117 | 1/1972 | Reilly, Jr. ................. | 307/512 X |
| 3,956,643 | 5/1976 | Hite .......................... | 307/497 |
| 4,339,631 | 7/1982 | Nishioka ................... | 307/512 X |
| 4,475,088 | 10/1984 | Beard ........................ | 307/512 X |
| 4,638,190 | 1/1987 | Hwang et al. ............. | 307/512 |
| 4,675,613 | 6/1987 | Naegeli et al. ............ | 307/529 X |

OTHER PUBLICATIONS

Shahrianry et al., "Practical Wideband GaAs Phase Detector", IEEE MMMC Symposium, Dallas, Tex., Jan. 18, 1982, pp. 47–49.
Al-Araji et al., "Freq.-Independent Analogue Phase--Shift Network Technique Using FETs", Radio & Electronic Engineer, vol. 50, No. 3, pp. 107–112, Mar. 1980.

Primary Examiner—Timothy P. Callahan
Attorney, Agent, or Firm—Edward W. Goodman

[57]  ABSTRACT

A wide-band phase shifter contains a first ($\phi_1$) and a second ($\phi_2$) parallel branch receiving the same input signal (e) and presenting at their output a first ($s_1$) and a second ($s_2$) output signal which are shifted with respect to each other by a given angle. The first branch includes a first phase shift module ($\phi_1$) and the second branch includes a second phase shift module ($\phi_2$). A first ($V_{\epsilon 1}$) and a second ($V_{\epsilon 2}$) control signal are processed by a negative feedback loop having a phase-sensitive detector (10) which receives the output signals ($s_1$, $s_2$). A control circuit (CC) receives a control signal ($\epsilon$) supplied by the detector (10) and produces the control signals ($V_{\epsilon 1}$, $V_{\epsilon 2}$). These signals are generated for producing the oppositely directed phase corrections in the two phase shift modules.

10 Claims, 4 Drawing Sheets

WIDE-BAND PHASE SHIFTER

This is a continuation of application Ser. No. 145,856, filed Jan. 20, 1988, now abandoned.

BACKGROUND OF THE INVENTION

The invention relates to a wide-band phase shifter comprising a first and second branch arranged in parallel and receiving the same input signal at their inputs and producing a first and a second output signal at their outputs, these output signals being phase-shifted with respect to each other by a given angle, the first branch comprising a first phase shift module producing a phase shift as a function of a first control signal, said control signal being processed by a negative feedback loop comprising a phase-sensitive detector and receiving said first and second output signals.

A phase shifter of this type is known from the Article published by Al-ARAJI et al in the magazine "The Radio and Electronic Engineer" Vol. 50, no. 3, pages 107-112, March 1980, entitled "Frequency-independent analog phase-shift network technique using field effect transistors".

This article describes a phase shifter for low frequencies which can be used in the frequency band of 20-80 kHz for producing a 90° phase shift between the two may be chosen to be within a range of ±20° around the value of 90°.

Such a phase shifter has drawbacks which are particularly due to the fact that the phase shift between the two output signals is produced by phase-shifting network arranged in one of the two branches, while the other branch comprises a resistive network. The result is that the amplitudes at the two outputs cannot be equalized very accurately in a large range of frequencies.

SUMMARY OF THE INVENTION

It is an object of the invention to give the phase shifter a symmetrical structure such that a high phase and amplitude precision in a large range of frequencies is ensured.

To this end, the phase shifter according to the invention is characterized in that the second branch comprises a second phase shift module and in that the negative feedback loop comprises a control circuit receiving the output signal of said phase-sensitive detector and producing said first control signal as well as a second control signal for controlling said second phase shift module, the two control signals being generated so as to produce oppositely directed phase corrections in the two phase shift modules.

The phase-sensitive detector may be a multiplier. The multiplier may advantageously be a transistor ring modulator, each of the output signals of the phase shifters and their inverse values being supplied thereto.

In this case, said multiplier may comprise a first and a second 0°-180° phase shifter particularly comprising MESFET differential amplifiers with an active charge receiving the first and the second output signal at their inputs so as to produce the output signals of the phase shifter and their inverse values.

In a preferred embodiment, said differential amplifiers comprise a stage including a first and a second MESFET transistor which are source-couples and whose drains constitute a first and a second output of the differential amplifier, as well as a third and a fourth MOS transistor whose source and drain are connected are connected to the source and the drain of the first and second transistor, respectively, and in that the first and second outputs of the differential amplifier are fed back to the gates of the third and fourth transistors, respectively, via a first and a second feedback capacitor.

The active charge may be constituted by a fifth and a sixth MESFET transistor whose source is connected to the drains of the first and second transistors, whose drain is connected to a power supply terminal and whose source and gate are interconnected via a third and a fourth capacitor, respectively, and whose gate is connected to the power supply terminal via a first and a second resistor, respectively.

In one embodiment, the control circuit comprises a first and second integrator and in that the output signal of the phase-sensitive detector is a differential signal applied to the inputs of the first and the second integrator. If necessary at least one of said first and second integrators comprises a circuit for level shift correction.

The phase of a phase shifter of this type can be controlled between 0° and 180°.

Such a phase shifter may comprise a differential input amplifier receiving an input signal and having an inverting output and a non-inverting output and a first and a second output stage of the push-pull type realized with MESFET transistors each comprising an inverting input and a non-inverting input, said inverting output controlling the inverting input of the first output stage and the non-inverting input of the second output stage and said non-inverting output controlling the non-inverting input of the first output stage and the inverting input of the second output stage, the output of the first output stage being charged by the drain-source path of a seventh transistor whose gate receives a control signal in series with a fifth capacitor, the output of the second output stage being charged by a third and a fourth resistor arranged in series, and in that the voltages present at the common terminal of the drain-source path of the seventh transistor and the fifth capacitor and at the common terminal of the third and fourth resistors are added by a second summation circuit whose output is the output of the phase shift module.

Such an arrangement has the advantage of a reduced common mode voltage.

BRIEF DESCRIPTION OF THE DRAWINGS

The invention will now be described in greater detail by way of example with reference to the accompanying drawings in which.

DETAILED DESCRIPTION OF THE INVENTION

Figure 1:
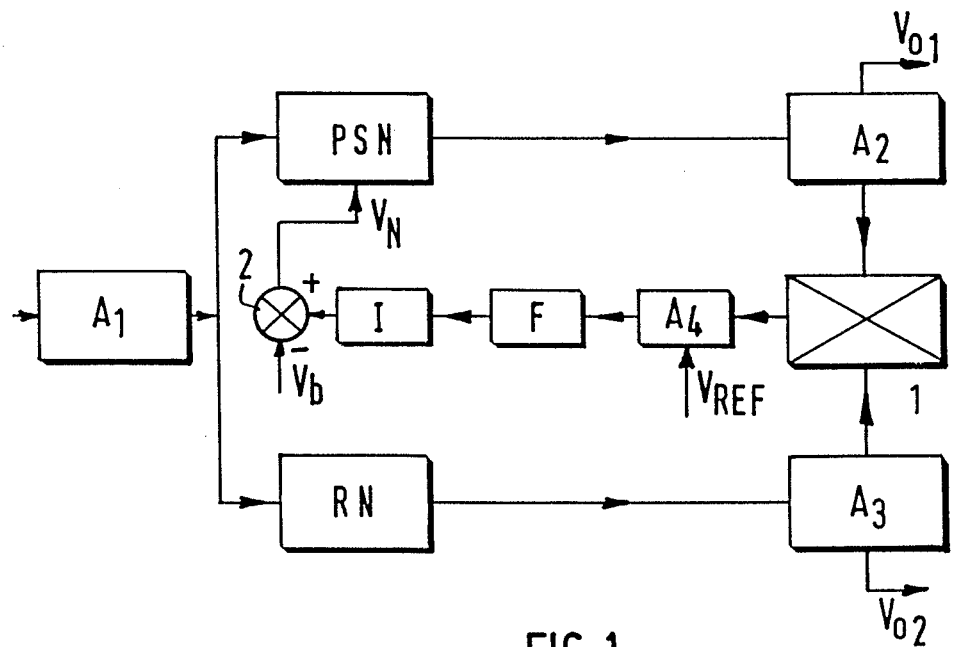
FIG. 1 is a diagram of a prior art phase shifter.

In FIG. 1 a prior art phase shifter (EL-ARAJI et al) comprises a buffer amplifier $A_1$, a first branch receiving the output signal from the amplifier $A_1$ and comprising successively a phase shifter constituted by a controllable phase-shifting network PSN and an output amplifier $A_2$, a second branch receiving the output signal from the amplifier $A_1$ comprising successively a resistive network RN having a gain which is substantially identical to that of the controllable phase-shifting network PSN, and an output amplifier $A_3$. The phase of the network PSN is controlled by a negative feedback loop comprising a phase-sensitive detector receiving the output signals $V_{o1}$ $V_{o2}$ from the output amplifiers $A_2$ and $A_3$, respectively, and whose output controls an amplifier $A_4$ which receives a voltage $V_{REF}$ for zero shift control and which is cascade-arranged successively with a filter F and an integrator I. The difference between the output signal of the integrator I and a nominal voltage $V_b$ is produced by a comparator 2 and constitutes the voltage $V_N$ which controls the phase shift produced by the network PSN. This voltage is applied to the gate of a field effect transistor so as to vary its drain-source resistance and hence the phase of an RC network in which it is incorporated. The presence of the resistive network in the second branch has for its object to realize an attenuation of the gain which is as close as possible to that produced by the network PSN so that, as far as is possible, the two output signals $V_{o1}$ and $V_{o2}$ have the same amplitude. Such an equalization of the amplitude an only be obtained with an accuracy for a given frequency. In a large frequency band, the network PSN does not have a constant attenuation.

Figure 2:
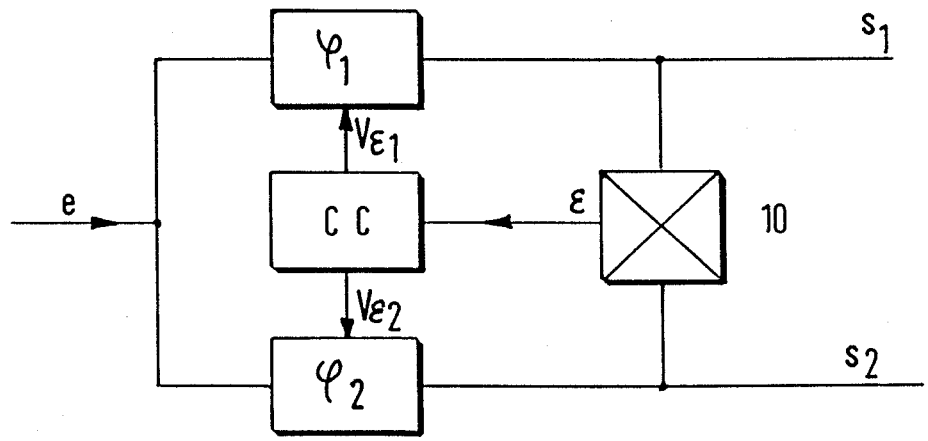
FIG. 2 is a diagram of a phase shifter according to the invention.

In FIG. 2 showing a phase shifter according to the invention, the first and second branches each comprise respective phase shift modules $\phi_1$ and $\phi_2$ which are each controlled by a control signal $V\epsilon_1$ and $V\epsilon_2$. The control signals are generated by a negative feedback loop comprising a phase-sensitive detector and a control circuit CC. The phase-sensitive detector is constituted by a multiplier 10 whose inputs receive the output signals $s_1$ and $s_2$ of the phase shift modules $\phi_1$ and $\phi_2$ which constitute the outputs of the phase shifter. This arrangement is preferably realized by charging the outputs $s_1$ and $s_2$ with the same impedances with which a very high precision can be obtained. The output signal of the multiplier 10 is a signal $\epsilon$ which controls a control circuit for generating the control signals $V\epsilon_1$ and $V\epsilon_2$ in conditions in which the phase corrections produced by the negative feedback loop are oppositely directed in the two phase shift modules. If it is assumed that the phase shift modules $\phi_1$ and $\phi_2$ can each be controlled to produce phase shifts between 0° and 180°, the phase corrections produced by the signals $V\epsilon_1$ and $V\epsilon_2$ may have an opposite direction with respect to a central phase shift value of 90° for a given frequency which is chosen, for example in the center of the band. In other words, when the phase shifter is adjusted in phase (that is to say $\epsilon = \cos\phi = 0°$ or $\phi = 90°$), the signal $s_1$ has a delay of 90° minus 45° (phase correction), or 45° with respect to the input signal e, and the signal $s_2$ has a delay of 90° plus 45° (phase correction in the opposite direction), or 135°, which corresponds to a phase shift of 90° between the outputs $s_1$ and $s_2$.

Figure 3:
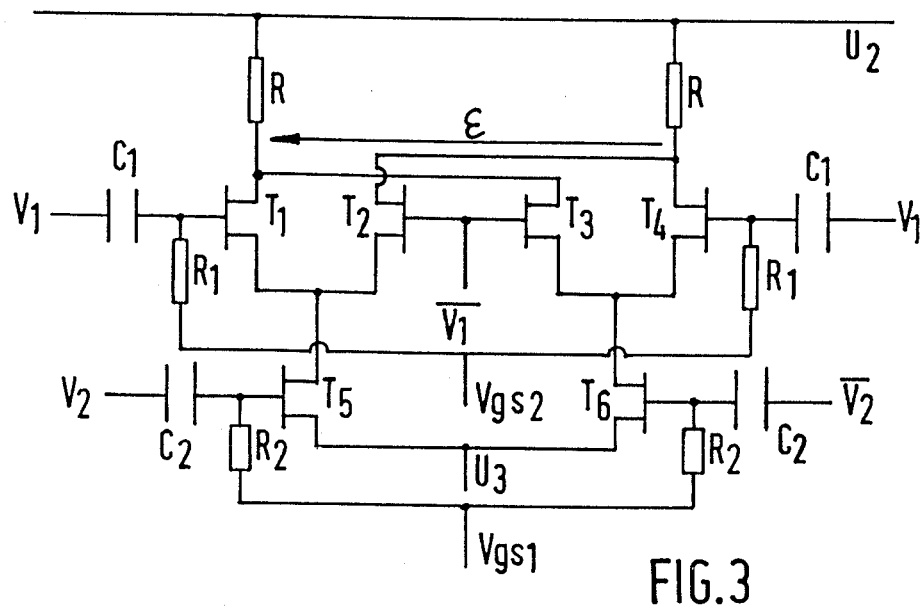
FIGS. 3 and 4 show a transistor ring modulator and a MESFET 0°-180° phase shifter, respectively, constituting a multiplier in one embodiment according to the invention.
Figure 4:
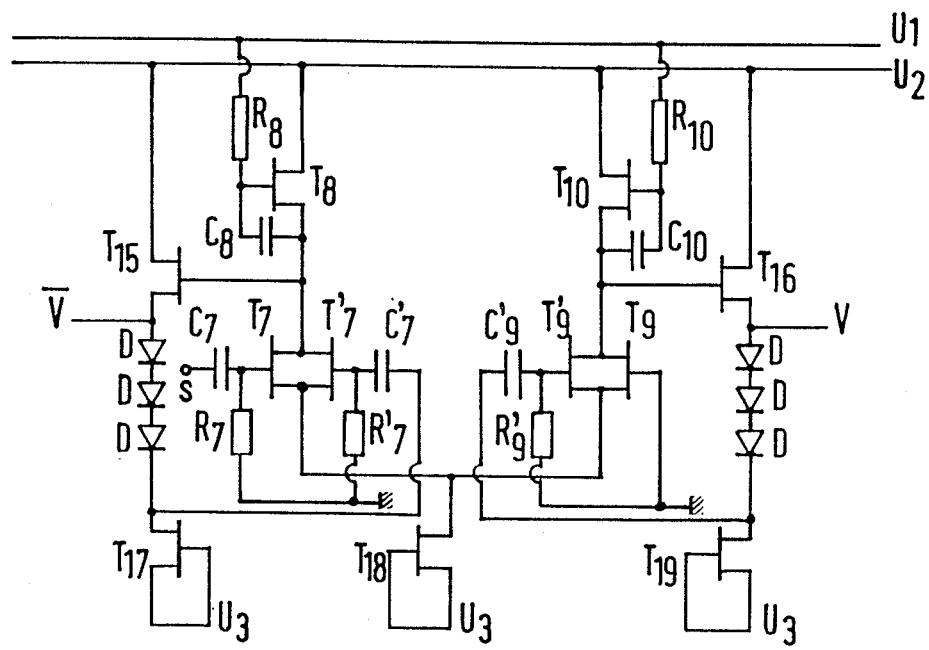

FIGS. 3 and 4 shown an embodiment of the multiplier 10 in a circuit of the transistor ring modulator type. The multiplier itself is shown in FIG. 3. It comprises a first stage comprising two differential stages each including two source-coupled MESFET transistors ($T_1$, $T_2$) and ($T_3$, $T_4$). The gates of the transistors $T_2$ and $T_3$ are interconnected. The drains of the transistors $T_1$ and $T_3$ are interconnected and are connected to a power supply source $U_2$ (of, for example, 6 V) via a resistor R. The drains of the transistors $T_2$ and $T_4$ are interconnected and are connected to the power supply source $U_2$ via another resistor R. The gates of the transistors $T_1$ and $T_4$ are connected to a power supply terminal $V_{gs2}$ (of, for example, $-2$ V) via respective resistors $R_1$. The gates of the transistors $T_1$ and $T_4$ receive a signal $V_1$ via respective capacitors $C_1$ and the gates of the transistors $T_2$ and $T_3$ receive the inverse value $\overline{V}_1$ of this signal. The second stage comprises a single differential stage constituted by source-coupled MESFET transistors $T_5$ and $T_6$ which sources are connected to a voltage source $Y_3$ (of, for example, $-4$ V), whilet the drain of the transistor $T_5$ is connected to the sources of the transistor $T_1$ and $T_2$ and the drain of the transistors $T_3$ and $T_4$. The gates of the transistors $T_5$ and $T_6$ are connected to power supply terminal $Bgs_1$ (of, for example, $-5.5$ V) each via a resistor $R_2$. The gate of the transistor $T_5$ receives a signal $V_2$ via the capacitor $C_2$ and that of transistor $T_6$ receives the inverse value $\overline{V}_2$ of this signal via another capacitor $C_2$. The output signal $\epsilon$ of the multiplier 10 is available in a differential form between the drains of the transistors $T_1$ $T_4$.

The signals $V_1$, $\overline{V}_1$, and $V_2$, $\overline{V}_2$ are produced by 0°-180° phase shifters, for example, by differential amplifiers, a preferred embodiment of which is shown in FIG. 4 and which have active charges. This embodiment comprises a differential stage with two source-coupled MESFET transistors $T_7$ and $T_9$ coupled by means of their sources and having their drains charged by transistors $T_8$ and $T_{10}$ which constitute said active charges. To this end the sources of the transistors $T_8$ and $T_{10}$ are connected to the drains of the transistors $T_7$ and $T_9$, respectively, the gate and the source of each transistor $T_8$ and $T_{10}$ are interconnected via capacitors $C_8$ and $C_{10}$, the gates of transistors $T_8$ and $T_{10}$ are connected to a power supply terminal $U_1$ (of, for example, 1.5 V) via polarization resistors $R_8$ and $R_{10}$, respectively, and the drains of the transistors $T_8$ and $T_{10}$ are connected to a second power supply terminal $U_2$ (of, for example, 6 V).

Such an active charge provides a gain which is relatively high at high frequencies where the capacitors $C_8$ and $C_{10}$ are equivalent to short-circuits while continuously preserving a gain of the order of one (for transistors having the same geometry). The outputs V and $\overline{V}$ of the differential amplifier are the sources of the two transistors $T_{16}$ and $T_{15}$ arranged as source followers at the drains of the transistors $T_9$ and $T_7$. A transistor $T_{18}$, whose source and gate are interconnected and are connected to a power supply terminal $U_3$ (of, for example, $-4$ V) and whose drain is connected to the sources of the transistors $T_7$ and $T_9$, constitutes the current source of the differential stage $T_7$ $T_9$. An input signal s is applied to the gate of the transistor $T_7$ which is connected to the common mode terminal (ground) via a resistor $R_7$. The gate of $T_9$ is also connected to ground. An optimum function of the differential amplifier can be realized by combining each transistor $T_7$ and $T_9$ with a transistor of smaller dimensions $T'_7$ and $T'_9$, respectively, whose source and drain are connected to the source and drain of the transistors $T_7$ and $T_9$, respectively. The gates of the transistors $T_7$, $T'_7$ and $T'_9$ are connected to the common mode terminal (ground) via resistors $R_7$, $R'_7$ and $R'_9$, respectively, while the gate of transistor $T_9$ is directly connected to the common mode terminal. The gates of transistor $T'_7$ and $T'_9$ receive a negative feedback signal from the outputs of the amplifier, that is to say, the respective sources of the transistors $T_{15}$ and $T_{16}$. To this end, a plurality of level shifting diodes, in this case 3, are arranged in series in the forward direction with the sources of the transistors $T_{15}$ and $T_{16}$ and with transistors $T_{17}$ and $T_{19}$ arranged as a current source similarly as the transistor $T_{18}$. The negative feedback is obtained by connecting the drains of the transistors $T_{17}$ and $T_{19}$ to the gates of the transistors $T'_7$ and $T'_9$ via decoupling capacitors $C'_7$ and $C'_9$, respectively. The passage of a given current in the series-arranged diodes ensures an accurate voltage drop in the series-arranged diodes and an accurate level compensation for the negative feedback.

The 0°-180° phase shifter has an input at the gate of the transistor $T_7$, preferably via a capacitor $C_7$, and receives the signal s, which is one of the signals $s_1$ or $s_2$, for producing at the output at the sources of the transistors $T_{15}$ and $T_{16}$, the signals $V_1$ and $\overline{V}_1$ in the first case and the signals $V_2$ and $\overline{V}_2$ in the second case, respectively.

Figure 5:
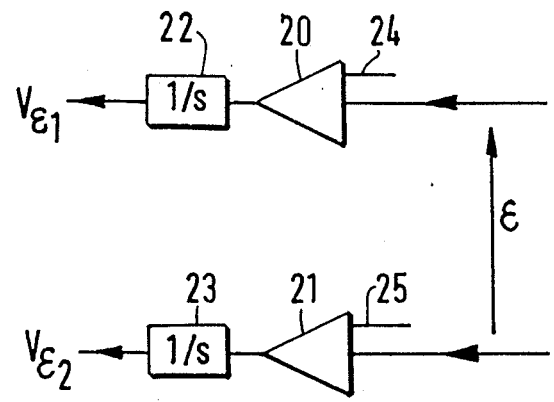
FIG. 5 shows an embodiment of a control circuit according to the invention.

In FIG. 5, the control circuit cc comprises two amplifiers 20 and 21 associated with the integrators 22 and 23, respectively. If required, the amplifiers 20 and 21 may each have an input 24 and 25 for receiving the level shifting of the signals $V\epsilon_1$ and $V\epsilon_1$. It should be noted that for the values given by way of example in the description of FIG. 3 and for a pinch-off voltage $V_p$ of the transistors of $-2.5$ V, the signal $\epsilon$ directly presents a level shift which is compatible with the circuit to be described with reference to FIG. 6b with the same values of the voltages $U_1$, $U_2$ and $U_3$ which are given by way of example.

Figure 6A:
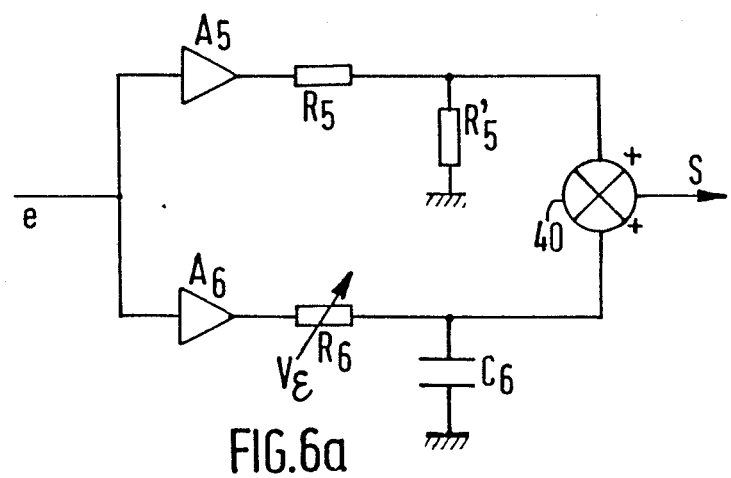
FIGS. 6a and 6b show a circuit of a phase shifter according to the invention and a preferred method of realizing such a phase shifter.

In FIG. 6a, a phase shift module ($\phi_1$, $\phi_2$) comprises two parallel branches receiving the input signal e. The first parallel branch comprises an amplifier $A_5$ whose output is charged by two identical series-arranged resistors $R_5$ and $R'_5$, $R'_5$ having a terminal connected to the common mode terminal. The junction terminal of the resistors $R_5$ and $R'_5$ constitutes the output of the first branch. The second parallel branch comprises an inverter amplifier $A_6$ whose output is charged by a variable resistor $R_6$ whose value is controlled by a voltage $V_\epsilon$ and a capacitor $C_6$ having a terminal connected to the common mode terminal. The junction terminal of the resistor $R_6$ and the capacitor $C_6$ constitutes the output of the second branch. The voltage $V_\epsilon$ is equal to $V_{\epsilon 1}$ for the module $\phi_1$ and to $V_{\epsilon 2}$ for the module $\phi_2$.

The outputs of the two branches are combined by means of a summation circuit 40 whose output provides a signal S which is the signal $s_1$ for the module $\phi_1$ and the signal $s_2$ for the module $\phi_2$.

With $R_5 = R'_5$ and the two amplifiers $A_5$ and $A_6$ having the same gain A, we have:

$$S = \frac{AVe}{2} - \frac{AVe}{jC_6\omega} \cdot \frac{1}{R_6 + \frac{1}{jC_6\omega}}$$

or $$S = \frac{-AVe}{2} \cdot \frac{1 - \tau p}{1 + \tau p}$$

The phase shift for a given frequency depends on the time constant $\tau = R_6 C_6$.

We have $$\left|\frac{S}{e}\right| = \frac{A}{2} \quad \Delta\phi = 180° - 2 \operatorname{Arc\,tg} p\tau$$

Thus a phase shift $\Delta\phi$ can be written, which varies between 0° and 180° in accordance with the value of $\tau$, thus of R.

Figure 6B:
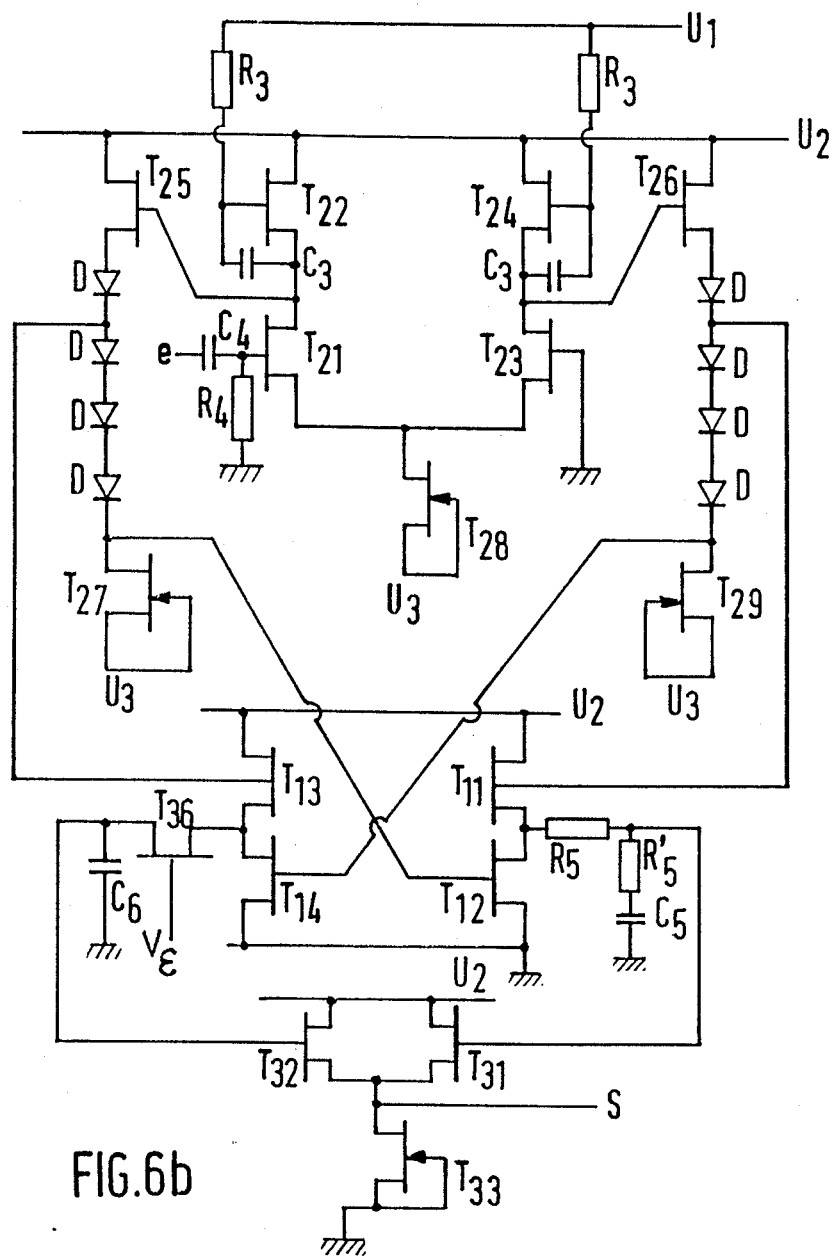

FIG. 6b shows a particularly advantageous embodiment of the 0°-180° phase shifter with a differential input stage including MESFET transistors having an active charge and an output stage for each amplifier embodying the MESFET transistors arranged in a push-pull configuration by which the residual common mode voltage can be optimized. An improvement of the phase up to the cut-off frequency of the transistor is thus obtained.

In FIG. 6b the phase shifter comprises a differential input stage including two MOS transistors $T_{21}$ and $T_{23}$ whose source are intercoupled and connected to a current source constituted by a transistor $T_{28}$ whose gate and source are connected to the power supply terminal $U_3$ (of, for example $-4$ V) and whose drain is connected to the sources of the transistors $T_{21}$ and $T_{23}$. The input voltage e is applied to the gate of transistor $T_{21}$ via a decoupling network comprising a series capacitor $C_4$ and a resistor $R_4$ arranged in parallel between the gate of transistor $T_{21}$ and the common mode terminal. The gate of transistor $T_{23}$ is directly connected to the common mode terminal.

In order to improve the response of the stage, the drains of the transistors $T_{21}$ and $T_{23}$ are associated with an active charge constituted by MESFET transistors $T_{22}$ and $T_{24}$ whose sources are connected to the drain of the corresponding transistors $T_{21}$ and $T_{23}$ and which comprise capacitors capacitors $C_3$ of low value (of the order of a picofarad) connected between their sources and their gates. The gate of each transistor $T_{22}$ and $T_{24}$ is connected to a power supply terminal $U_1$ (of, for example, $+1.5$ V), via a resistor $R_3$, while their drains are connected to a power supply terminal $U_2$ (of, for example, $+6$ V).

Transistors $T_{25}$ and $T_{26}$, arranged as followers whose drains are directly connected to the power supply source $U_2$, receive the drain voltages of the transistors $T_{21}$ and $T_{23}$, respectively, at their gates. The sources of transistors $T_{25}$ and $T_{26}$ are each connected to a group if several series-arranged diodes D, in this example 4 diodes, so as to realize a level adaptation for the push-pull output stages. Transistors $T_{27}$ and $T_{29}$, arranged as a current source in a manner analogous to transistor $T_{28}$, have their drains connected to the cathode of the last diode of each group so as to define the current flowing through the diodes D and thus the voltage drop in these diodes D.

The sources of the transistors $T_{25}$ and $T_{26}$ are connected to the gates of the transistors $T_{13}$ and $T_{11}$, respectively, with the voltage drop across one diode, and to the gates of the transistors $T_{12}$ and $T_{14}$, respectively, with the voltage drop across the four diodes.

The resistors $R_5$ and $R'_5$ are arranged in series between the output of the push-pull stage $T_{11}$, $T_{12}$ and the common mode terminal with the interpositioning of a decoupling capacitor $C_5$ of the order of nF. The variable resistor $R_6$ is the drain source resistor of a MESFET transistor $T_{36}$ whose drain is connected to the output of the push-pull stage $T_{13}$, $T_{14}$ and whose source is connected to the ungrounded terminal of the capacitor $C_6$.

The summation circuit 40 is constituted by two MESFET transistors $T_{31}$ and $T_{32}$ whose drains are connected to the power supply source $U_2$, and whose sources are interconnected and connected to a transistor $T_{33}$ arranged as a current source in a manner analogous to transistor $T_{28}$. The source of transistor $T_{36}$ is connected to the gate of transistor $T_{32}$ and the common terminal of the resistors $R_5$ and $R'_5$ is connected to the gate of transistor $T_{31}$ which produces the sum S of their voltages at the sources of the transistors $T_{31}$ and $T_{32}$. To vary the phase shift between 0° and 180°, the voltage $V_\epsilon$ must be varied up to the pinch-off voltage of the channel of the transistor $T_{36}$. At the value of the voltages $U_1$, $U_2$, $U_3$, $Vgs_1$ and $Vgs_2$, when the phase difference of shift between the outputs $s_1$ and $s_2$ is 90°, the signals which control the inputs of the amplifiers 20 and 21, which is compatible with the control of the gate of transistor $T_{36}$ are both at the level of +4 V for the amplifiers 20 and 21 having a gain which is unitary.

The invention is not limited to the embodiment described. For example, other circuits embodying the MESFET transistors may be used. The phase-sensitive detector may be, inter alia, a known double-balanced multiplier.

What is claimed is:

1. A wide-band phase shifter comprising a first and a second branch arranged in parallel and receiving the same input signal at their inputs and producing a first and a second output signal at their outputs, said output signals being phase-shifted with respect to each other by a given angle, the first branch comprising a first phase shift module producing said first output signal having a phase shift as a function of a first control signal, said control signal being processed by a negative feedback loop comprising a phase-sensitive detector and receiving said first and second output signals, characterized in that the second branch comprises a second phase shift module for producing said second output signal, said second phase shift module having the same structure as said first phase shift module, and in that the negative feedback loop comprises a control circuit receiving the output signal of said phase-sensitive detector and producing said first control signal as well as a second control signal for controlling said second phase shift module, the two control signals being generated so as to produce oppositely directed phase corrections in the two phase shift modules, wherein said control circuit controls the phase shifts of said first and second phase shift modules between 0° and 180°.

2. A phase shifter as claimed in claim 1, characterized in that said first and second phase shift modules each comprises a differential input amplifier receiving an input signal and having an inverting output and a non-inverting output and a first and a second output stage of the push-pull type realized with MESFET transistors each comprising an inverting input and a non-inverting input, said inverting output controlling the inverting input of the first stage and the non-inverting input of the second output stage and said non-inverting output controlling the non-inverting input of the first output stage and the inverting input of the second output stage, the output of the first output stage being charged by the drain-source path of a seventh transistor whose gate receives a control signal in series with a fifth capacitor, the output of the second output stage being charged by a third and a fourth resistor arranged in series, and in that the voltages present at the common terminal of the drain-source path of the seventh transistor and the fifth capacitor and at the common terminal of the third and fourth resistors are added by a second summation circuit whose output is the output of the phase shift module.

3. A wide-band phase shifter comprising a first and a second branch arranged in parallel and receiving the same input signal at their inputs and producing a first and a second output signal at their outputs, said output signals being phase-shifted with respect to each other by a given angle, the first branch comprising a first phase shift module producing said first output signal having a phase shift as a function of a first control signal, said control signal being processed by a negative feedback loop comprising a phase-sensitive detector and receiving said first and second output signals, characterized in that the second branch comprises a second phase shift module for producing said second output signal, said second phase shift module having the same structure as said first phase shift module, and in that the negative feedback loop comprises a control circuit receiving the output signal of said phase-sensitive detector and producing said first control signal as well as a second control signal for controlling said second phase shift module, the two control signals being generated so as to produce oppositely directed phase corrections in the two phase shift modules, wherein the phase-sensitive detector includes a multiplier having inputs coupled to receive said first and second output signals, and an output for providing the output signal of said phase-sensitive detector.

4. A phase shifter as claimed in claim 3, characterized in that said phase shifter further comprises means for producing inverse values of said first and second output signals, sand said multiplier comprises a transistor ring modulator having inputs coupled to receive said first and second output signals and said inverse values of said first and second output signals, and an output for providing the output signal of the phase-sensitive detector.

5. A phase shifter as claimed in claim 4, characterized in that said means for producing inverse values comprises a first and a second 0°–180° phase shifter having inputs for receiving said first and second output signals, respectively, and outputs for providing the inverse values of said first and second output signals, respectively.

6. A phase shifter as claimed in claim 1, characterized in that the 0°–180° phase shifters are MESFET differential amplifiers with an active charge.

7. A phase shifter as claimed in claim 6, characterized in that said differential amplifiers comprise a stage including a first and a second MESFET transistor which are source-coupled and whose drains constitute a first and a second output of the differential amplifier, as well as a third and a fourth MOS transistor whose source and drain are connected to the source and the drain of the first and the second transistor, respectively, and in that the first and second outputs of the differential amplifier are fed back to the gates of the third and fourth transistors, respectively, via a first and a second feedback capacitor.

8. A phase shifter as claimed in claim 7, characterized in that the active charge comprises a fifth and a sixth MESFET transistor whose source is connected to the drain of the first and second transistors, respectively, whose drain is connected to a power supply terminal and whose source and gate are connected via a third and a fourth capacitor, respectively, and whose gate is connected to the said power supply terminal via a first and a second resistor.

9. A wide-band phase shifter comprising a first and a second branch arranged in parallel and receiving the same input signal at their inputs and producing a first and a second output signal at their outputs, said output signals being phase-shifted with respect to each other by a given angle, the first branch comprising a first phase shift module producing said first output signal having a phase shift as a function of a first control signal, said control signal being processed by a negative feedback loop comprising a phase-sensitive detector and receiving said first and second output signals, characterized in that the second branch comprises a second phase shift module for producing said second output signal, said second phase shift module having the same structure as said first phase shift module, and in that the negative feedback loop comprises a control circuit receiving the output signal of said phase-sensitive detector and producing said first control signal as well as a second control signal for controlling said second phase shift module, the two control signals being generated so as to produce oppositely directed phase corrections in the two phase shift modules, wherein the output signal of said phase-sensitive detector comprises a first and a second differential signal, and said control circuit comprises a first and a second integrator having respective inputs coupled to receive the first and second differential signals from said phase-sensitive detector, and respective outputs for providing said first and said second control signals.

10. A phase shifter as claimed in claim 9, characterized in that said control circuit further comprises a level shift correction circuit having an input for receiving one of said first and second differential signals from said phase-sensitive detector and an output coupled to the input of a respective one of said first and second integrators for correcting a level of said one of said first and second differential signals applied to the input of said respective one of said first and second integrators.

* * * * *